United States Patent
Jamal et al.

(12) 
(10) Patent No.: US 6,741,140 B2
(45) Date of Patent: May 25, 2004

(54) CIRCUIT FOR RECEIVING AN AC COUPLED BROADBAND SIGNAL

(75) Inventors: Riyaz R. Jamal, Nepean (CA); Gilbert P. Brunette, Nepean (CA); Simon C. Tsang, Regina (CA)

(73) Assignee: Nortel Networks Limited, St. Laurent (CA)

( * ) Notice: Subject to any disclaimer, the term of this patent is extended or adjusted under 35 U.S.C. 154(b) by 138 days.

(21) Appl. No.: 10/012,478

(22) Filed: Dec. 12, 2001

(65) Prior Publication Data

US 2003/0107450 A1 Jun. 12, 2003

(51) Int. Cl.$^7$ ............................................... H03H 7/38
(52) U.S. Cl. .................................... 333/32; 330/304
(58) Field of Search ......................... 333/302–306, 333/32, 33

(56) References Cited

U.S. PATENT DOCUMENTS

| | | | |
|---|---|---|---|
| 4,713,563 A | 12/1987 | Marshall et al. ............ | 307/490 |
| 4,978,872 A | 12/1990 | Morse et al. ............... | 307/490 |
| 5,301,081 A | 4/1994 | Podell et al. ............... | 361/56 |
| 5,339,047 A * | 8/1994 | Mizan et al. ............... | 330/286 |
| 5,424,691 A * | 6/1995 | Sadinsky .................... | 333/17.3 |
| 5,463,359 A | 10/1995 | Heaton ....................... | 333/32 |
| 5,650,908 A | 7/1997 | Stanton ....................... | 361/113 |
| 5,969,582 A | 10/1999 | Boesch et al. .............. | 333/129 |
| 6,243,566 B1 * | 6/2001 | Peckham et al. ........ | 455/127.4 |
| 6,414,562 B1 * | 7/2002 | Bouisse et al. ............... | 333/32 |

OTHER PUBLICATIONS

TriQuint Semiconductor Product Data Sheet "DC—14 GHz Power Amplifier", Texas USA, Mar. 23, 2001.

* cited by examiner

*Primary Examiner*—Robert Pascal
*Assistant Examiner*—Kimberly E Glenn
(74) *Attorney, Agent, or Firm*—Max R. Wood; Ogilvy Renault (57) ABSTRACT

A receiving circuit having a termination impedance and an equalization capacitor. The receiving circuit is connectable to a signal source having a source impedance through a DC (direct current) blocking capacitor. The value of the equalization capacitor is chosen such that voltage spikes otherwise caused by the blocking capacitor are eliminated. The receiving circuit is especially useful in distributed electronic amplifiers and electro-optic modulators.

10 Claims, 8 Drawing Sheets

CIRCUIT FOR RECEIVING AN AC COUPLED BROADBAND SIGNAL

CROSS-REFERENCE TO RELATED APPLICATIONS

This is the first application filed for the present invention.

TECHNICAL FIELD

The present invention relates to the field of broadband receivers and, in particular, to circuit for receiving an AC coupled broadband signal.

BACKGROUND OF THE INVENTION

AC (alternating current) coupling of circuits is necessary when interfacing circuits having different bias voltages. AC coupling is typically performed by a DC (direct current) blocking capacitor.

Figure 1:
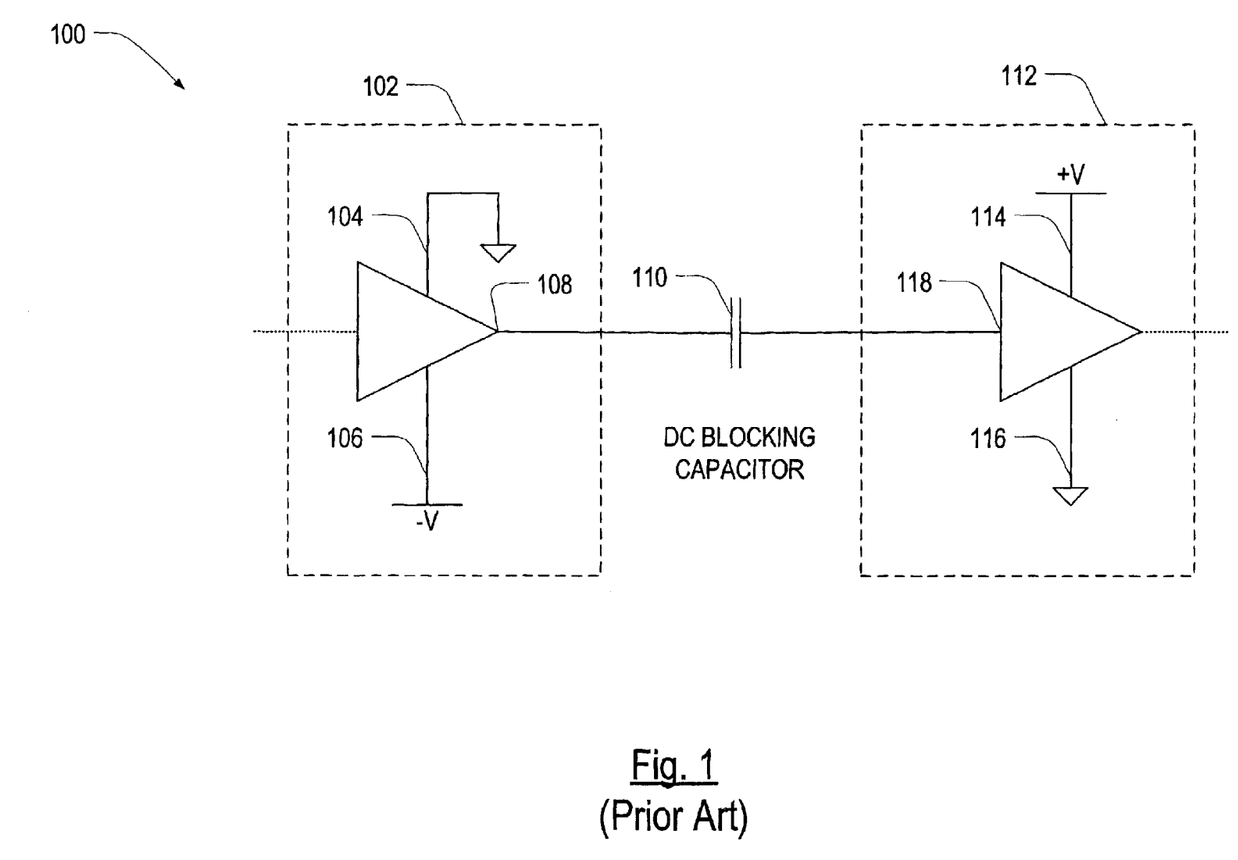
FIG. 1 is a schematic diagram of a circuit with cascading stages having different operating voltages.

FIG. 1 is a schematic diagram of an example of a circuit 100 with cascading stages, an output stage 102 and a receiving stage 112, having different operating voltages. The output stage 102 operates between a ground reference 104 and a negative supply 106; the receiving stage 112 operates between a positive voltage supply 114 and a ground reference 116. Hence, an output 108 of the output stage 102 will be incompatible with an input 118 of the receiving stage 112 unless a DC blocking capacitor 110 is inserted between the output 108 of the output stage 102 and the input 118 of the receiving stage.

Figure 2:
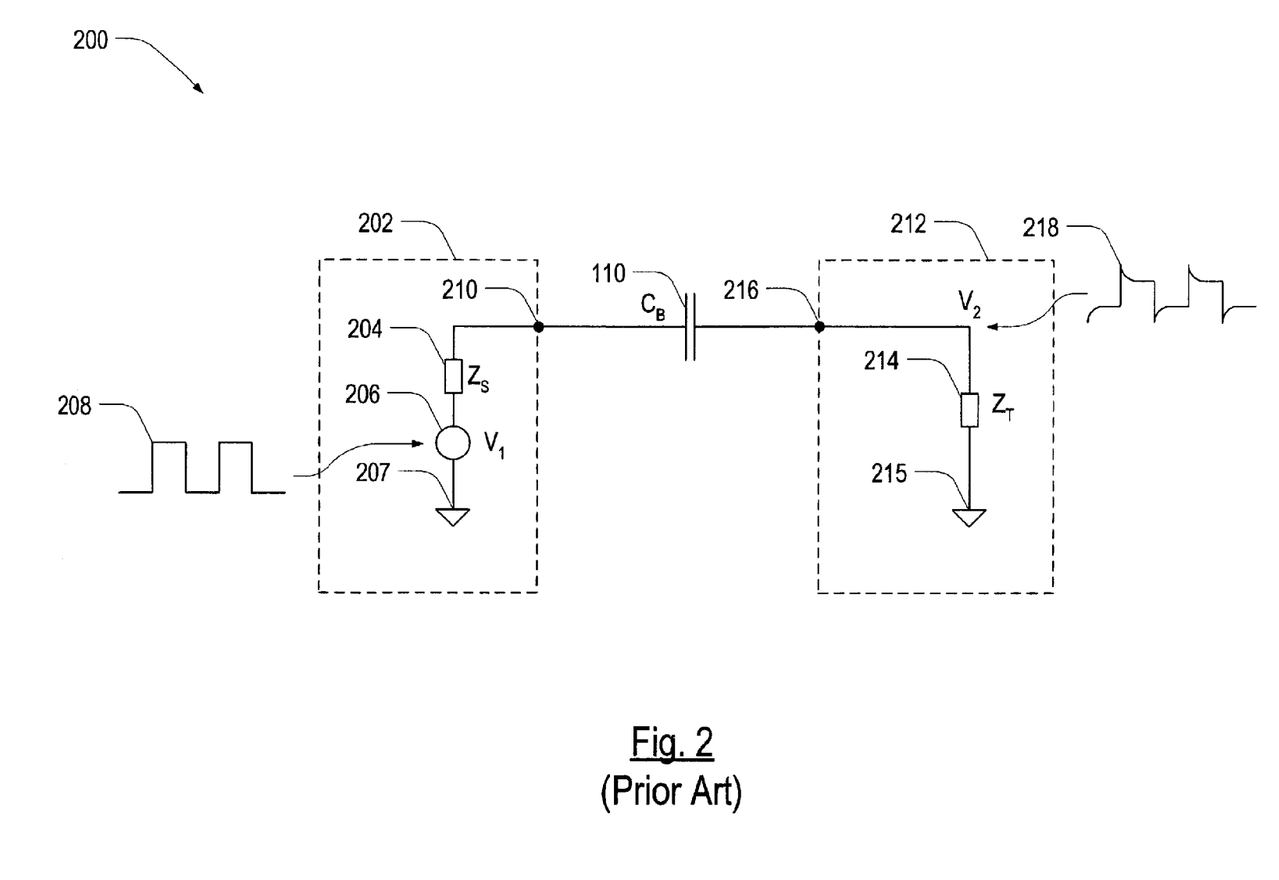
FIG. 2 is a schematic diagram of an AC equivalent circuit of the circuit shown if FIG. 1.

FIG. 2 is a schematic of an AC circuit 200 equivalent to the circuit 100 shown in FIG. 1. An equivalent of output stage 202 includes a source impedance 204, having a value $Z_S$, and a voltage source 206 connected in series between an output 210 and a ground reference 207. An equivalent circuit of the receiving stage 212 includes a termination impedance 214, having a value $Z_T$, connected from an input 216 to a ground reference 215. In this example the voltage source 206 generates a digital waveform 208 such as an NRZ (non-return to zero) or RZ (return to zero) bit stream. A simple rectangular wave 208 is shown for convenience in this example. A resulting waveform 218 at the input 216 to the receiving stage 212 has voltage spikes and distortion due to a differentiating effect of the blocking capacitor 110.

Those voltage spikes can damage an amplifier's input stage resulting in either immediate failure or early life failures. This problem is more acute when using high supply voltages in the order of 10 to 12 V instead of more typical 7 to 8 V, for example, in multi-chip modules, interfacing two modules from different suppliers or interfacing RF (radio frequency) drivers to electro-optical modulators, especially crystal-cut Lithium Niobate high speed electro-optical modulators which require high drive voltages.

The problem is more severe when long runs of consecutive ones and zeroes occur in the digital waveform 208. In SONET (synchronous optical network) systems, SONET scrambling algorithms take care of this to some extent but some operating conditions such as start-up or test conditions may nevertheless result in long runs of ones or zeros.

Another possible solution is diode clamps consisting of stacks of diodes to snub out spikes. This is usually not sufficient and a disadvantage is that they distort the waveform.

SUMMARY OF THE INVENTION

It is therefore an object of the present invention to provide a receiving circuit that overcomes the problems and disadvantages of the prior art stated above.

In accordance with the invention there is provided a receiving circuit that includes a termination impedance and an equalization capacitor. The value of the equalization capacitor is chosen such that voltage spikes and distortion on a received signal are significantly reduced.

In accordance with another aspect of the invention there is provided a distributed electronic amplifier having a receiving circuit that includes a termination impedance and an equalization capacitor. The value of the equalization capacitor is chosen such that voltage spikes and distortion on a received signal are substantially reduced.

In accordance with still another aspect of the invention there is provided an electro-optic modulator having a receiving circuit that includes a termination impedance and an equalization capacitor. The value of the equalization capacitor is chosen such that voltage spikes and distortion on a received signal are substantially reduced.

BRIEF DESCRIPTION OF THE DRAWINGS

Further features and advantages of the present invention will become apparent from the following detailed description, taken in combination with the appended drawings, in which.

It will be noted that throughout the appended drawings, like features are identified by like reference numerals.

DETAILED DESCRIPTION OF THE PREFERRED EMBODIMENT

The invention provides a termination impedance and an equalization capacitor connected in series from an input node to a reference node in a broadband receiving circuit to significantly reduce voltage spikes and distortion in a received signal.

In broadband transmission applications where a DC blocking capacitor is required in a broadband transmission line, and a broadband signal is being transmitted at a high frequency (e.g. in a frequency range of DC-40 GHz) physically implementing the DC blocking capacitor results in greater distortion to the signal than arises due to the differentiating action alone. This is due to the fact that the DC blocking capacitor, because it is required to have a large capacity due to the extension of the spectrum of the transmitting signal to zero frequency, is also large in physical size. The large device yields an electromagnetic discontinuity in the transmission line system that connects it to the transmitting and receiving circuits. This, in turn, imparts distortion to the transmitted signal, particularly to high frequency components of the signal spectrum.

Figure 3:
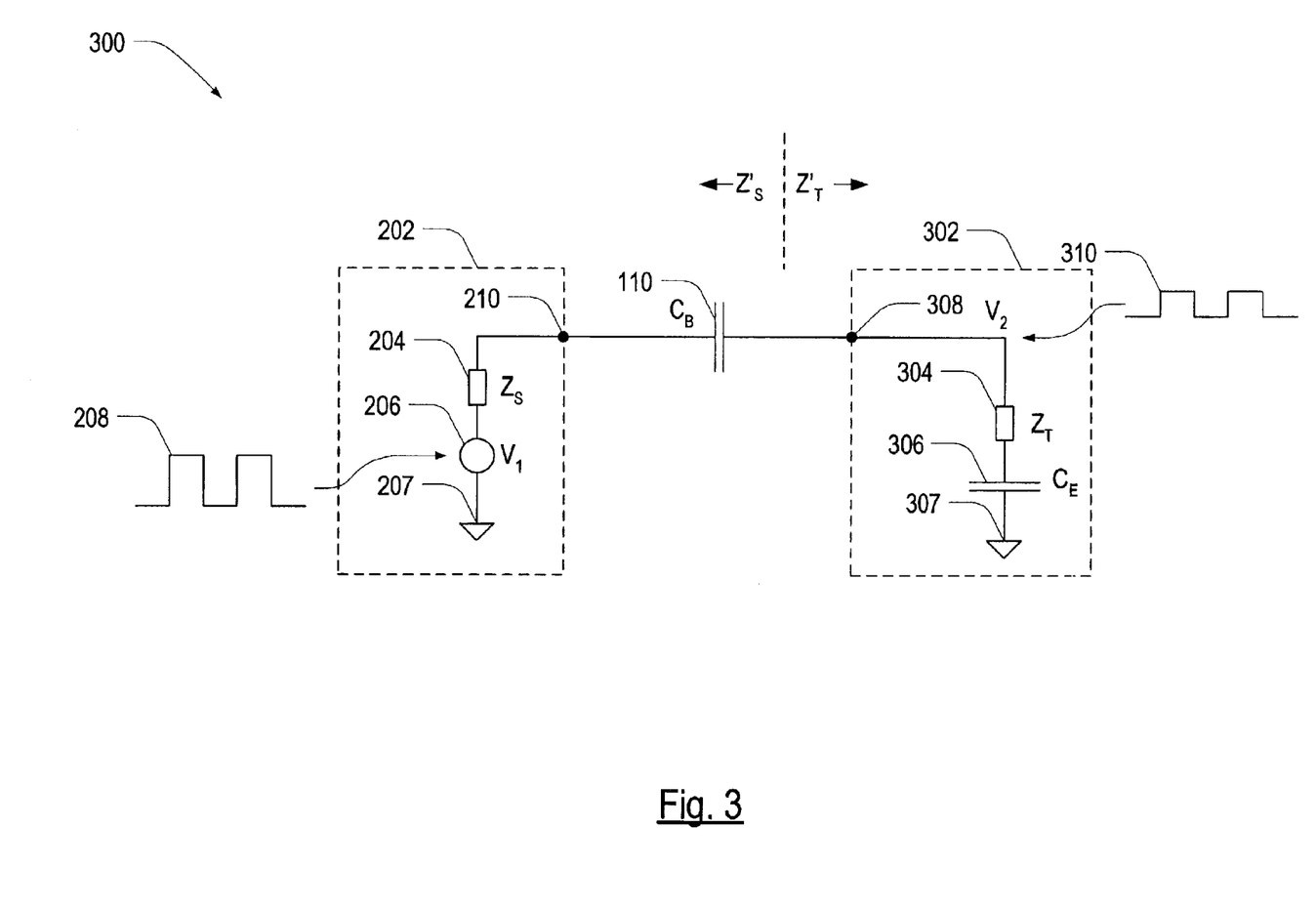
FIG. 3 is a schematic diagram of a circuit including a preferred embodiment of the invention.

FIG. 3 is a schematic diagram of an exemplary circuit 300 including a preferred embodiment of the invention. The circuit 300 comprises the output stage 202 and the blocking capacitor 110, shown in FIG. 2, as described above. A receiving circuit 302 includes a termination impedance 304 and an equalization capacitor 306 connected in series from an input node 308 to a reference node, which is preferably a ground reference 307.

Using the circuit 300 in accordance with the invention (with the equalization capacitor 306) permits the use of a DC blocking capacitor 110 of smaller value due to the compensating equalization capacitor 306. Ideally, the DC blocking capacitor 110 can be infinitesimally small in value. Practically, this is not the case due to mismatches between the equalization capacitor 306 and DC blocking capacitor 110 which result in distortion imparted to the spectrum of the transmitted signal, particularly for low frequencies. Nonetheless, the compensation effect is sufficient to permit the DC blocking capacitor 110 to be significantly lower in capacity than when the equalization capacitor 306 is not used. This permits the DC blocking capacitor 110 to be significantly smaller in physical size, which reduces the distortion imparted to the transmitted signal at high frequencies due to the reduced electromagnetic discontinuity.

It should be noted for the purposes of this description that the source impedance $Z_S$ 204 is an equivalent impedance and not necessarily a discreet component. Also note that the voltage source 206 is a Thevenin equivalent open circuit voltage source and not necessarily a discreet component. The output stage 202 is an equivalent representation of many different technologies such as TTL (transistor—transistor logic), ECL (emitter coupled logic) or CMOS (complementary metal-oxide semiconductor), for example.

It should also be noted that the termination impedance 304 and the equalization capacitor 306 of the receiving circuit 302 may be discreet components or may be integrated on a single substrate such as an IC (integrated circuit), hybrid circuit or the like.

It is advantageous that a voltage ($V_2$) on the input node 308 be proportional to a voltage ($V_1$) of the voltage source 206. A ratio of these voltages is given by the equation:

$$\frac{V_2}{V_1} = \frac{Z'_T}{Z'_S + Z'_T}$$

where $Z'_S$ is an equivalent impedance at the input node 308 of the output stage 202 and blocking capacitor 110 and $Z'_T$ is an equivalent impedance at the input node 308 of the receiving circuit 302

In this example $$Z'_S = Z_S + \frac{1}{SC_B} \text{ and } Z'_T = Z_T + \frac{1}{SC_E}$$

where S is a complex frequency variable.

$C_E$ is chosen such that Im $$\text{Im}\left[\frac{Z'_T}{Z'_S + Z'_T}\right] = 0.$$

Therefore, the voltage ($V_2$) on the input node 308 is proportional to the voltage ($V_1$) of the voltage source 206 and voltage spikes and distortion otherwise caused by the blocking capacitor 110 are, for all practical purposes, eliminated.

In an especially preferred embodiment $Z_T=R_T$ and $Z_S=R_S$ (where $R_T$ and $R_S$ are non-reactive impedances or resistive) therefore $$C_E = \frac{R_S C_B}{R_T}.$$

Furthermore, if $R_T=R_S$ then $C_E=C_B$.

Figure 4:
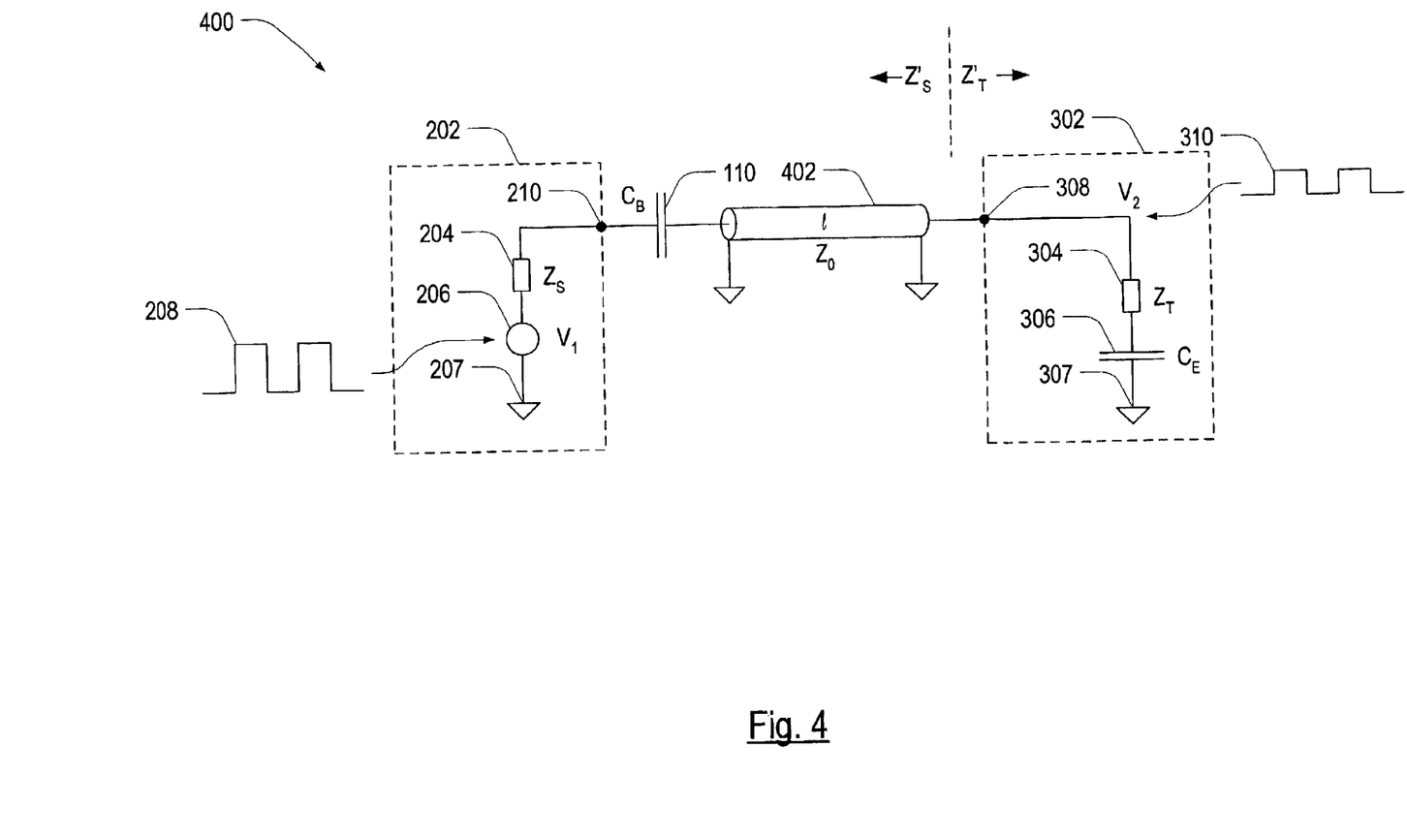
FIG. 4 is a schematic diagram of another circuit including a preferred embodiment of the invention.

FIG. 4 is a schematic diagram of another exemplary circuit 400 including a preferred embodiment of the invention. The circuit 400 of FIG. 4 is identical to the circuit 300 of FIG. 3, except that the blocking capacitor 110 is connected to the input node 308 of the receiving circuit 302 via a transmission line 402 of length l and having a characteristic impedance $Z_0$. The transmission line 402 may be any type of conductor that has transmission line properties, such as a coaxial cable, micro-strip or the like.

Figure 5:
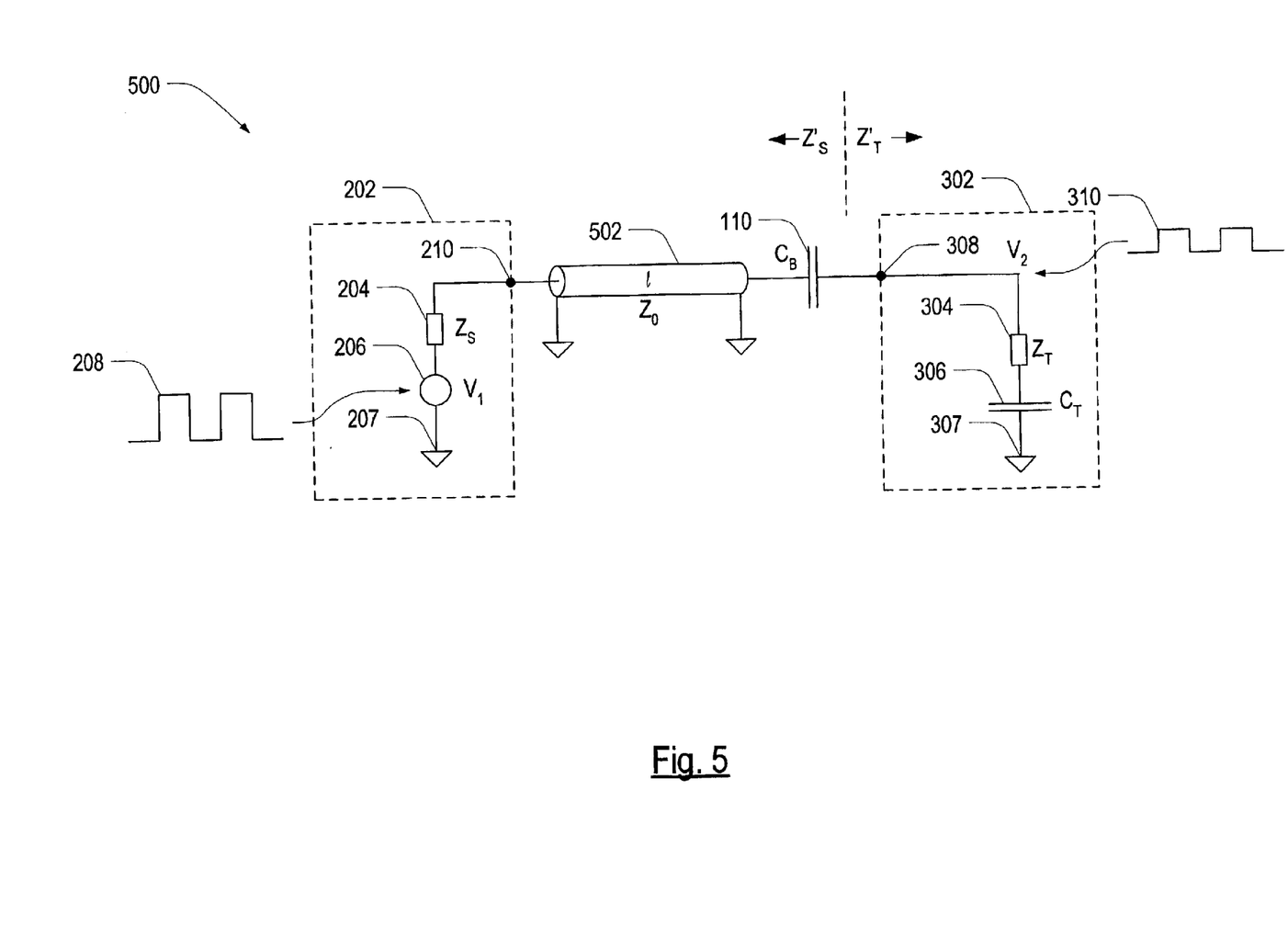
FIG. 5 is a schematic diagram of another circuit including a preferred embodiment of the invention.

FIG. 5 is a schematic diagram of another exemplary circuit 500 including a preferred embodiment of the invention. The circuit 500 of FIG. 5 is identical to the circuit 300 of FIG. 3, except that the blocking capacitor 110 is connected to the output node 210 of the output stage 202 via a transmission line 502 of length l and having a characteristic impedance $Z_0$.

Figure 6:
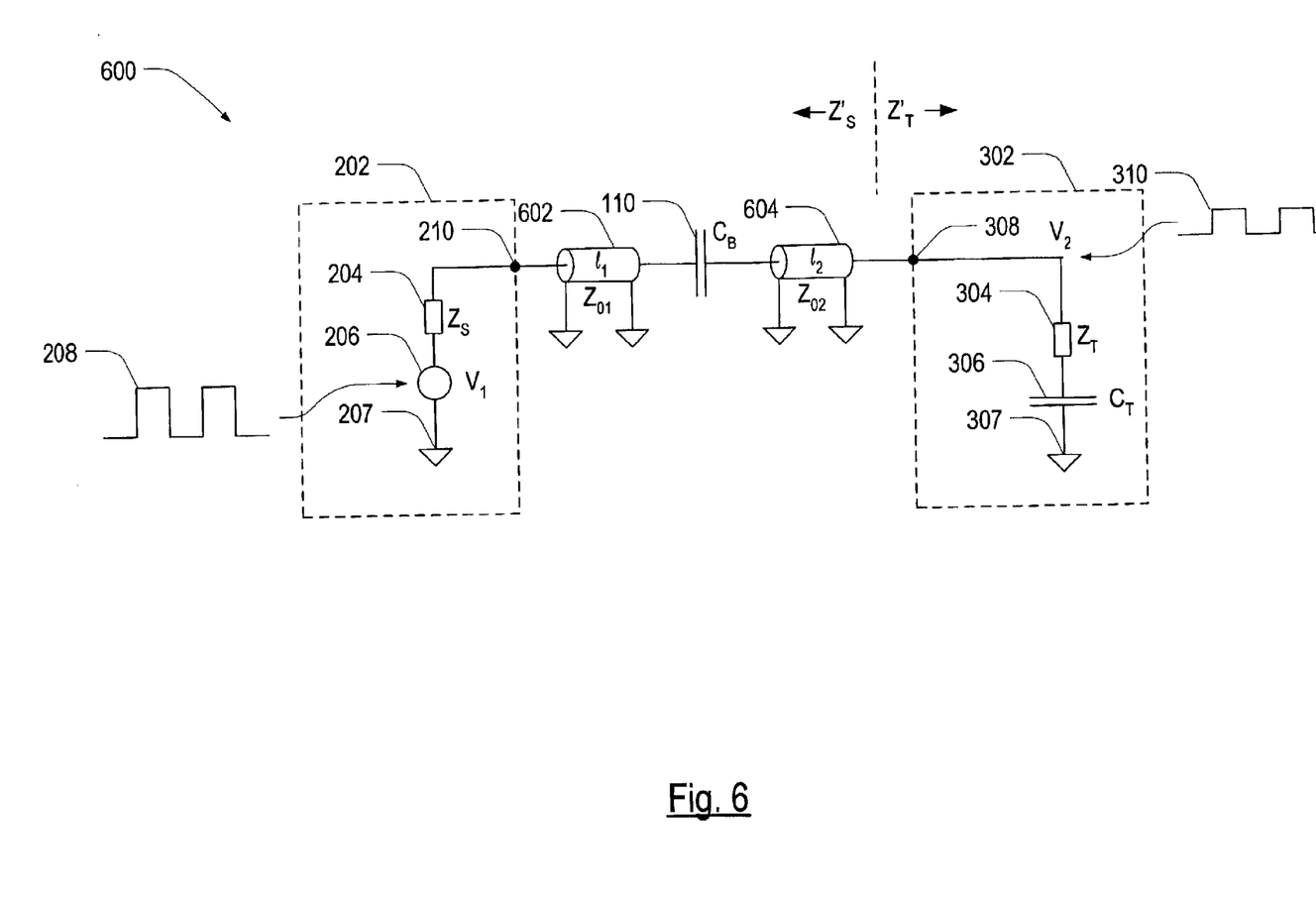
FIG. 6 is a schematic diagram of yet another circuit including a preferred embodiment of the invention.

FIG. 6 is a schematic diagram of yet another exemplary circuit 600 including a preferred embodiment of the invention. The circuit 600 of FIG. 6 is identical to the circuit 300 of FIG. 3 except that the blocking capacitor 110 is connected to the output node 210 of the output stage 202 via a transmission line 602 of length $l_1$, having a characteristic impedance $Z_{01}$. The blocking capacitor 110 is also connected to the input node 308 of the receiving circuit 302 via a transmission line 604 of length $l_2$ and having a characteristic impedance $Z_{02}$.

In the embodiments shown in FIGS. 4, 5 and 6, $C_E$ is chosen such that Im $$\text{Im}\left[\frac{Z'_T}{Z'_S + Z'_T}\right] = 0$$

where $Z'_S$ is an equivalent impedance of the source impedance 204, blocking capacitor 110 and respective transmission lines 402,502,602,604 and $Z'_T$ is the same as in the embodiment shown in FIG. 3.

Figure 7:
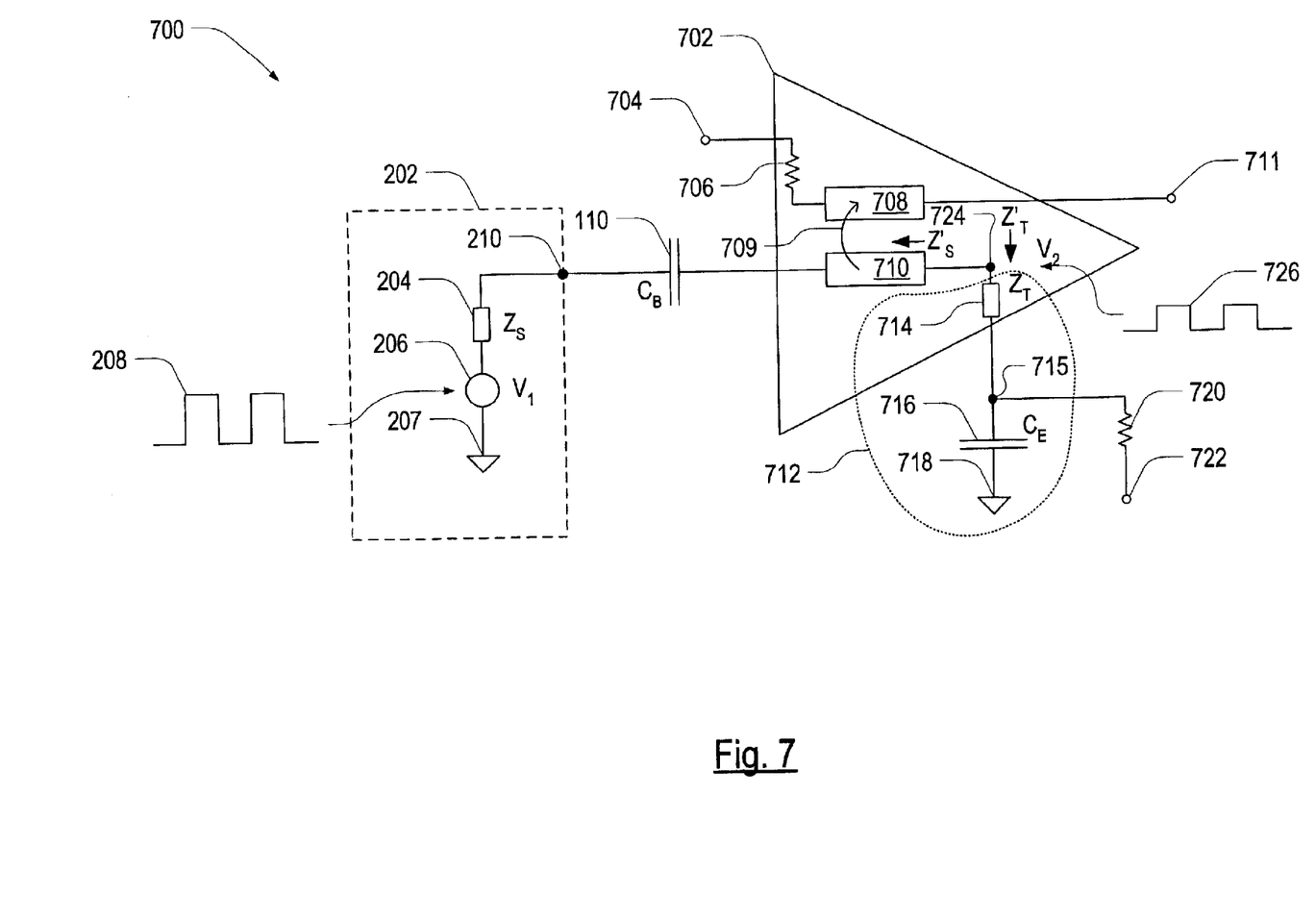
FIG. 7 is a schematic diagram of a circuit including the invention used in a distributed electronic amplifier.

FIG. 7 is a schematic diagram of an exemplary circuit 700 including the invention used in a distributed electronic amplifier 702. An output stage 202 and a blocking capacitor 110 are identical to that shown in FIG. 3. The amplifier 702 includes a first transmission line 708 connected to a power supply 704 via a first biasing resistor 706 and an amplifier output 711. A second transmission line 710 is coupled to the first transmission line 708 by multiple transconductors 709. A receiving circuit 712 having an input node 724 is connected to the blocking capacitor via the second transmission line 710. The receiving circuit 712 is identical to that shown in FIG. 3 except that a second biasing resistor 720 connected from a node 715 between a termination impedance 714 and a power supply 722.

Figure 8:
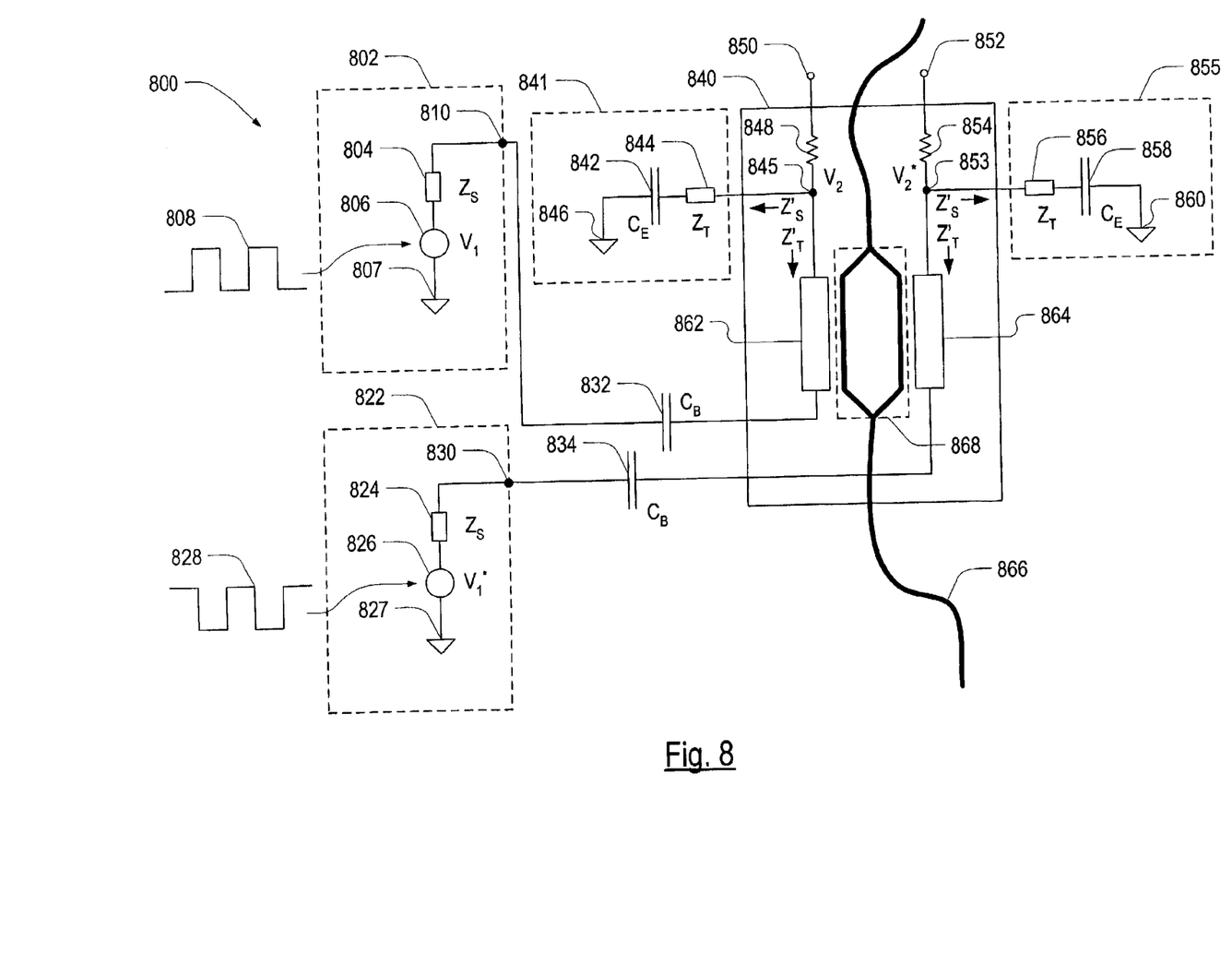
FIG. 8 is a schematic diagram of a circuit including the invention used in a electro-optic modulator.

FIG. 8 is a schematic diagram of another exemplary circuit 800 including the invention used in an electro-optic modulator 840 which is preferably a Mach-Zehnder modulator. A first output stage 802 and a first blocking capacitor 832 are identical to the output stage 202 and blocking capacitor 110 shown in FIG. 3. A second output stage 822 and a second blocking capacitor 834 are identical to the first output stage 802 and the first blocking capacitor 832 except that a voltage source 826 has a voltage, $V_1^*$, that is a complement of a voltage $V_1$ of a voltage source 806 of the first output stage 802. A waveform 808 and a waveform 828 are exemplary waveforms of the voltage source 806 of the first output stage 802 and the voltage source 826 of the second output stage 822 respectively. The electro-optic modulator 840 has a first electrode 862 and a second electrode 864 connected from the first blocking capacitor 832 and second blocking capacitor 834 to a first input node 845 and second input node 853 respectively. A first receiving circuit 841 and a second receiving circuit 855, which are identical to the receiving circuit 302 shown in FIG. 3, are respectively connected to the first input node 845 and the second input node 853. A first biasing resistor 848 and a second biasing resistor 854 are connected from a first DC bias supply 850 and second DC bias supply 852 to the first input node 845 and the second input node 853 respectively. The electro-optic modulator also has a optical fiber 866 coupled the first and second electrodes 862,864 via a waveguide 868.

In the embodiments shown in FIGS. 7 and 8, $C_E$ is determined the same way as for the embodiment shown in FIG. 3.

The invention therefore provides a receiving circuit for receiving an AC coupled broadband signal that substantially eliminates voltage spikes and distortion.

The embodiment(s) of the invention described above is(are) intended to be exemplary only. The scope of the invention is therefore intended to be limited solely by the scope of the appended claims.

We claim:

1. A receiving circuit for receiving a signal supplied by a source having a non-reactive source impedance and connected in series with a direct current blocking capacitor, the receiving circuit comprising a non-reactive termination impedance and an equalization capacitor connected in series from an input node to a reference node, wherein values of the termination impedance and equalization capacitor are determined by the equation:

$$\text{Im}\left[\frac{Z'_T}{Z'_S + Z'_T}\right] = 0$$

wherein $Z'_T$ is an equivalent impedance of the receiving circuit and $Z'_S$ an equivalent impedance of the source impedance and the blocking capacitor, whereby a voltage of the input node is substantially proportional to an open circuit voltage of the source.

2. The receiving circuit as claimed in claim 1 wherein the source impedance is substantially equal to the termination impedance.

3. A distributed electronic amplifier comprising a receiving circuit for receiving a signal supplied by a source having a non-reactive source impedance and connected in series with a direct current blocking capacitor, the receiving circuit comprising a non-reactive termination impedance and an equalization capacitor connected in series from an input node to a reference node, wherein values of the termination impedance and equalization capacitor are determined by the equation:

$$\text{Im}\left[\frac{Z'_T}{Z'_S + Z'_T}\right] = 0$$

wherein $Z'_T$ is an equivalent impedance of the receiving circuit and $Z'_S$ is an equivalent impedance of the source impedance and the blocking capacitor, whereby a voltage of the input node is substantially proportional to an open circuit voltage of the source.

4. The distributed electronic amplifier as claimed in claim 3 wherein the source impedance is substantially equal to the termination impedance.

5. An electro-optic modulator comprising a receiving circuit for receiving a signal output by a source having a non-reactive source impedance and connected in series with a direct current blocking capacitor, the receiving circuit comprising a non-reactive termination impedance and an equalization capacitor connected in series from an input node to a reference node, values of the termination impedance and equalization capacitor are determined by the equation:

$$\text{Im}\left[\frac{Z'_T}{Z'_S + Z'_T}\right] = 0$$

wherein $Z'_T$ is an equivalent impedance of the receiving circuit and $Z'_S$ is an equivalent impedance of the source impedance and the blocking capacitor, whereby a voltage of the input node is substantially proportional to an open circuit voltage of the source.

6. The electro-optic modulator as claimed in claim 5 wherein the source impedance is substantially equal to the termination impedance.

7. The electro-optic modulator as claimed in claim 5 wherein the electro-optic modulator is a Mach-Zehnder modulator.

8. A receiving circuit for receiving a signal supplied by a source having a non-reactive source impedance and connected in series with a direct current blocking capacitor via a transmission line, the receiving circuit comprising a non-reactive termination impedance and an equalization capacitor connected in series from an input node to a reference node, wherein values of the termination impedance and equalization capacitor are determined by the equation:

$$\text{Im}\left[\frac{Z'_T}{Z'_S + Z'_T}\right] = 0$$

wherein $Z'_T$ is an equivalent impedance of the receiving circuit and $Z'_S$ is an equivalent impedance of the source impedance, the blocking capacitor, and the transmission line, whereby a voltage of the input node is substantially proportional to an open circuit voltage of the source.

9. A distributed electronic amplifier comprising a receiving circuit for receiving a signal supplied by a source having a non-reactive source impedance and connected in series with a direct current blocking capacitor via a transmission line, the receiving circuit comprising a non-reactive termination impedance and an equalization capacitor connected in series from an input node to a reference node, wherein values of the termination impedance and equalization capacitor are determined by the equation:

$$\text{Im}\left[\frac{Z'_T}{Z'_S + Z'_T}\right] = 0$$

wherein $Z'_T$ is an equivalent impedance of the receiving circuit and $Z'_S$ is an equivalent impedance of the source impedance, the blocking capacitor, and the transmission line, whereby a voltage of the input node is substantially proportional to an open circuit voltage of the source.

10. A Mach-Zehnder modulator comprising a receiving circuit for receiving a signal supplied by a source having a source impedance and connected in series with a direct current blocking capacitor via a transmission line, the receiving circuit comprising a termination impedance and an equalization capacitor connected in series from an input node to a reference node, wherein values of the termination impedance and equalization capacitor are determined by the equation:

$$\text{Im}\left[\frac{Z'_T}{Z'_S + Z'_T}\right] = 0$$

wherein $Z'_T$ is an equivalent impedance of the receiving circuit and $Z'_S$ is an equivalent impedance of the source impedance, the blocking capacitor, and the transmission line, whereby a voltage of the input node is substantially proportional to an open circuit voltage of the source.

* * * * *